US010985477B1

United States Patent
Wrobel et al.

(10) Patent No.: US 10,985,477 B1
(45) Date of Patent: Apr. 20, 2021

(54) REMOVABLE TERMINAL BLOCK ASSEMBLY THAT PERMITS AN I/O BASE TO OPERATE IN SIMPLEX MODE OR DUPLEX MODE

(71) Applicant: Rockwell Automation Technologies, Inc., Mayfield Heights, OH (US)

(72) Inventors: Adam M. Wrobel, Gates Mills, OH (US); Doug A. Lostoski, Richfield, OH (US); Daniel E. Killian, Eastlake, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 16/583,971

(22) Filed: Sep. 26, 2019

(51) Int. Cl.
*H01R 9/24* (2006.01)
*H01R 43/20* (2006.01)
*H01R 27/02* (2006.01)
*H01R 13/514* (2006.01)

(52) U.S. Cl.
CPC ......... *H01R 9/2408* (2013.01); *H01R 9/2491* (2013.01); *H01R 13/514* (2013.01); *H01R 27/02* (2013.01); *H01R 43/20* (2013.01); *H01R 2201/26* (2013.01)

(58) Field of Classification Search
CPC .. H01R 9/2408; H01R 9/2491; H01R 13/514; H01R 27/02; H01R 31/005; H01R 2201/26; H01R 25/16; H05K 7/1468; H02B 1/46; H02B 1/30; B60R 16/0238; B60R 16/0239
USPC .......................... 439/713, 949, 715, 716, 638
See application file for complete search history.

(56) References Cited

U.S. PATENT DOCUMENTS

| 6,425,770 | B1 | 7/2002 | Lostoski et al. |
| 6,549,034 | B1 | 4/2003 | Pietrzyk et al. |
| 6,909,923 | B2 | 6/2005 | Vasko et al. |
| 6,939,153 | B1 * | 9/2005 | Kondas ................. H01R 13/73 439/211 |
| 7,101,188 | B1 * | 9/2006 | Summers ............. H01R 12/721 439/59 |
| 7,596,635 | B2 | 9/2009 | Siorek et al. |
| 7,602,617 | B2 | 10/2009 | Brandt et al. |
| 8,149,554 | B2 | 4/2012 | Pietrzyk et al. |

(Continued)

FOREIGN PATENT DOCUMENTS

| DE | 101 35 980 C1 | 4/2003 |
| EP | 2 698 677 A1 | 2/2014 |

OTHER PUBLICATIONS

European Search Report, dated Jan. 21, 2021, in connection with EP Appln. No. 20190174.1.

*Primary Examiner* — Renee S Luebke
*Assistant Examiner* — Paul D Baillargeon
(74) *Attorney, Agent, or Firm* — Fay Sharpe LLP

(57) ABSTRACT

An I/O device includes an I/O base, at least two I/O modules supported on the I/O base, and a duplex terminal block assembly supported on the I/O base. The at least two I/O modules include a first I/O module and a second I/O module coupled to the duplex terminal block assembly in parallel. The duplex terminal block assembly can include connectors for connecting to a field device. The duplex terminal block assembly can include conductive structures for coupling the connectors with each of the first and second I/O modules. The duplex terminal block can be installed in a pair of ports in an I/O base to connect two I/O modules in parallel.

10 Claims, 18 Drawing Sheets

(56) References Cited

U.S. PATENT DOCUMENTS

| | | |
|---|---|---|
| 8,184,417 B2 | 5/2012 | Pietrzyk et al. |
| 8,441,766 B2 | 5/2013 | Pietrzyk et al. |
| 8,769,158 B2 | 7/2014 | Kretschmann et al. |
| 9,325,110 B2 | 4/2016 | Lostoski et al. |
| 10,483,663 B2 | 11/2019 | Wrobel et al. |
| 10,579,558 B1 | 3/2020 | Sundaresh et al. |
| 10,631,426 B1 | 4/2020 | Lostoski et al. |
| 2002/0172467 A1* | 11/2002 | Anderson ............ G02B 6/3825 385/53 |
| 2007/0016701 A1 | 1/2007 | Siorek et al. |
| 2014/0226460 A1 | 8/2014 | Kretschmann et al. |
| 2015/0045936 A1 | 2/2015 | Alley et al. |
| 2015/0270652 A1 | 9/2015 | Lostoski et al. |

\* cited by examiner

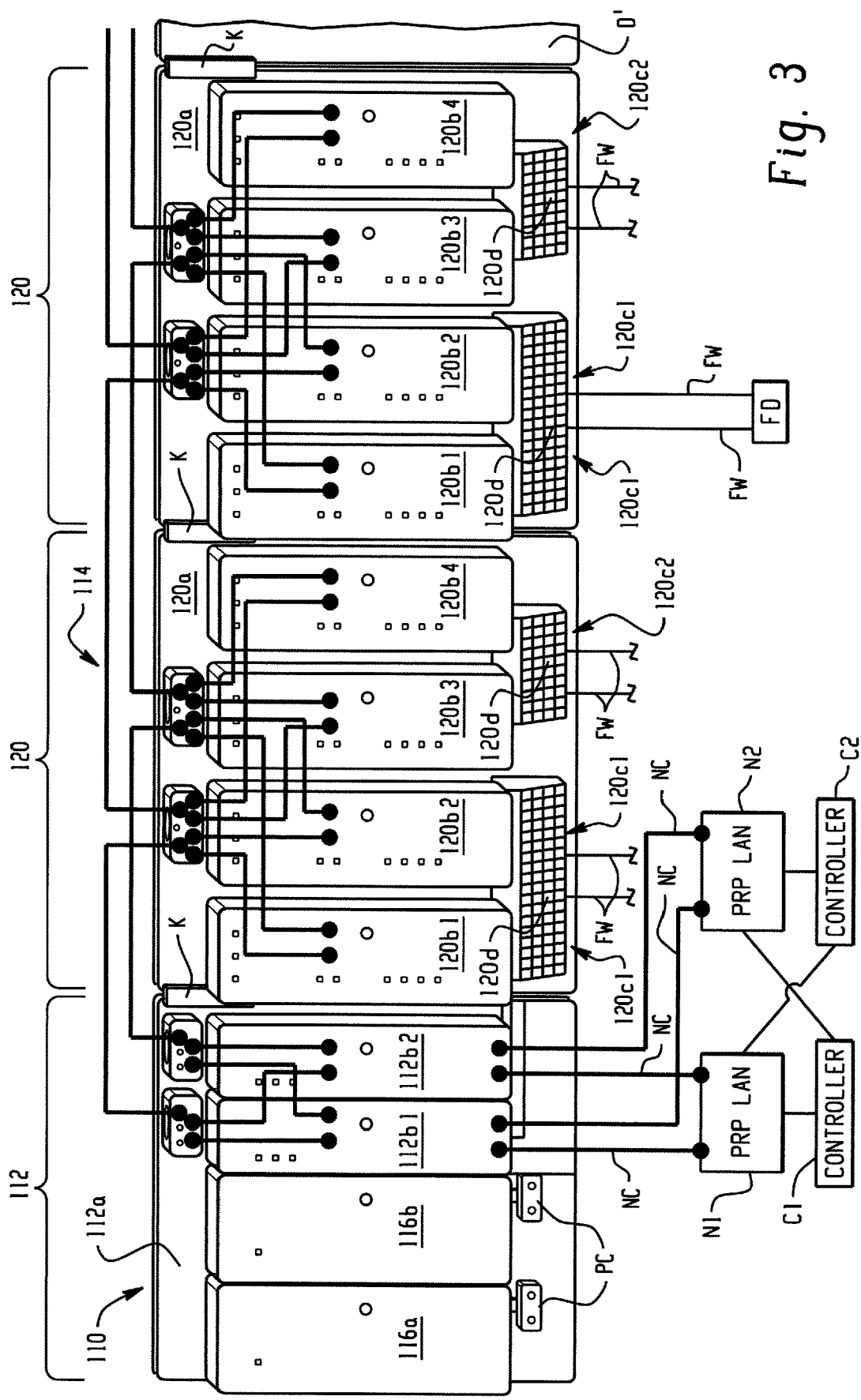

US 10,985,477 B1

REMOVABLE TERMINAL BLOCK ASSEMBLY THAT PERMITS AN I/O BASE TO OPERATE IN SIMPLEX MODE OR DUPLEX MODE

FIELD

The present development relates to industrial automation control systems and, more particularly, to a modular input/output (I/O) system having terminal blocks for coupling I/O modules to other components.

BACKGROUND INFORMATION

Distributed modular input/output (I/O) systems for industrial automation control fcsystems are well-known and in widespread use. Referring to FIG. 1, a known distributed modular I/O system 10 includes a network adapter 12 that is operatively connected to an industrial automation network N such as an Ethernet/IP network or other industrial automation network so that the network adapter 12 receives data from, transmits data to, and otherwise communicates with an industrial control module or "controller" C also connected to the network N. The controller C comprises one or more programmable logic controllers (PLC), microprocessors, and/or other electronic processors.

The adapter 12 includes an adapter base 12a that is mounted to a DIN rail D or other support structure, and an adapter module 12b is permanently or releasably connected to the adapter base 12a. The adapter module 12b includes the electronic circuitry for data communication data with the controller C via network N and for data communication with multiple I/O devices 20 of the system 10 as described below. The adapter 12 comprises one or more network connectors NC for connecting with the network N via known connectors such as RJ45 connectors, Small FormFactor Pluggable (SFP) connectors, or the like. The adapter 12 typically also includes a power input connector PC for connecting with a source of electrical power for supplying electrical power to the adapter module 12 and to the I/O devices 20 and other components operatively connected to the adapter 12 and/or I/O devices 20.

The I/O devices 20 each include an I/O base 20a also mounted to the DIN rail D or other support structure, with a first I/O base 20a located adjacent and operably physically and electrically connected to the adapter base 12a by a multi-contact electrical connector K and with the additional I/O bases 20a operably physically and electrically connected together one after the other in a sequential manner by successive mating multi-contact electrical connectors K such that a modular backplane circuit or "backplane" (illustrated as a broken line 14) is constructed and adapted for communicating electrical power and data through the successively connected I/O bases 20a and operably connects each I/O base 20a to the network adapter 12 and, thus, to the controller C. In addition to the I/O base 20a, each I/O device 20 further comprises an I/O module 20b operatively removably connected to the I/O base 20a such that the installed I/O module 20b also communicates with the network adapter 12 and the controller C over the backplane 14 such that input/output data are provided between the controller C and each I/O module 20b via backplane 14. Each installed I/O module 20b is selected and configured to perform one or more specialized input/output functions such as DC input, DC output, AC input, AC output, analog input and/or output, RTD and/or thermocouple input and/or thermocouple output, or the like as is generally known in the field of industrial automation.

Each I/O base 20a further includes a terminal block 20c comprising a plurality of cage clamps, spring clamps, screw terminals, or other wiring connectors 20d that are adapted to be connected to field cables or field wires FW that are each associated with a field device FD that is typically an analog or digital device such as a sensor, flow meter, switch, probe, thermocouple, RTD, encoder, or the like that is associated with the process or machine being controlled (the controlled system CS) by the controller C. The terminal block 20c can be a separate structure that is assembled to the I/O base 20a or can alternatively be defined as an integral or one-piece part of the I/O base 20a. Different varieties of terminal blocks 20a can be used depending upon the particular configuration required for the field device wiring connectors 20d, with some having different common terminals, ground connections, voltage supply terminals, and the like. Each installed I/O module 20b communicates with the field device wiring connectors 20d of the same I/O base 20a to which the I/O module 20b is physically connected. Input/output data are provided between the controller C and field device(s) FD connected to the corresponding I/O base 20a via backplane 14 and the network adapter module 12b.

FIG. 2A is a schematic representation of the distributed modular input/output (I/O) system 10 of FIG. 1. It can be seen that the backplane 14 includes only a single (non-redundant) circuit 14a that sequentially connects the network adapter 12 and the successively adjacent I/O devices 20 in a series or a sequential "daisy-chain" manner through the mated connectors K in the adapter base 12a and I/O bases 20a. In particular, the adapter 12 and each I/O device 20 include backplane circuitry that is located in the respective base 12a,20a and/or that is located in the adapter or I/O module 12b,20b connected to the respective base and that establishes the above-described backplane circuit 14 using known backplane data communication protocols. FIG. 2B is similar but shows another known system 10' wherein the network adapter 12' includes first and second redundant adapter modules 12b1,12b2 connected to the base 12a and wherein each I/O device 20' includes first and second redundant I/O modules 20b1,20b2 connected to the base 20a. In the case of FIG. 2B, fault tolerance is improved because a failed adapter module 12b1,12b2 or a failed I/O module 20b1,20b2 can be replaced without interrupting operation of the modular I/O system 10,10'. Like the system 10 of FIG. 2A, however, the backplane 14 includes only a single (non-redundant) circuit 14a that sequentially connects the network adapter 12 and the successively adjacent I/O devices 20 in a series or "daisy-chain" manner such that the backplane circuit 14 is interrupted by only a single point of failure.

SUMMARY

The systems of FIGS. 1, 2A, 2B do not provide a truly fault tolerant system in that the certain components are not redundant. Thus, if any single component fails at least a portion of the system and/or devices connected thereto are offline until a repair can be made or system functionality can otherwise be restored. A need has been identified for an I/O system that avoids this single-point failure outcome for certain applications including many industrial automation control applications, such as distributed control systems for process and plant control where continuous and uninterrupted operation of the controlled process or system is a critical requirement. In addition, such a system should allow for easy configuration of redundant components (e.g., a pair of I/O modules operating in simplex vs. a pair of I/O modules operating in duplex).

In accordance with one aspect of the present development, an I/O device includes an I/O base, at least two I/O modules supported on the I/O base, and a duplex terminal block assembly supported on the I/O base. The at least two I/O modules include a first I/O module and a second I/O module coupled to the duplex terminal block assembly in parallel.

The duplex terminal block assembly can include connectors for connecting to a field device. The duplex terminal block assembly can include conductive structures for coupling the connectors with each of the first and second I/O modules.

The duplex terminal block assembly can include a terminal block base and a terminal block supported on the terminal block base. The terminal block base can have a width that is twice the width of the terminal block. The terminal block can be centered along the width of the terminal block base. The terminal block can be received in a slot of the terminal block base. The I/O device can further include a third I/O module and a simplex terminal block assembly electrically coupled to the third I/O module. The simplex terminal block assembly can have a width that is half the width of the duplex terminal block assembly. The I/O base can includes a plurality of ports (sometimes referred to as terminal block landing points), each port adapted to couple one of the plurality of I/O modules to a terminal block assembly, and wherein the duplex terminal block is received in at least two ports associated with the first and second I/O modules, and wherein the simplex terminal block is received in a port associated with the third I/O module.

In accordance with another aspect, a duplex terminal block assembly for use with an associated I/O device having an I/O base with at least two ports for receiving at least a portion of a terminal block assembly and at least two I/O modules supported on the I/O base, the duplex terminal block assembly includes a terminal block base portion having connectors for coupling with the I/O base of the associated I/O device, and a terminal block extending from the terminal block base portion and having connectors for connecting to an associated field device. The terminal block base portion has a width such that it is at least partially received in each of the at least two ports when installed in the I/O base, and the duplex terminal block includes conductive structures for coupling each of the at least two I/O modules in parallel to the connectors.

The terminal block base portion can have a width that is twice the width of the terminal block. The terminal block can be centered along the width of the terminal block base portion. The terminal block and terminal block base portion can be separate components assembled together to form the duplex terminal block assembly. The terminal block can be received in a slot of the terminal block base portion.

In accordance with another aspect, a method of assembling an I/O device having at least two I/O modules connected in duplex to a field device includes coupling at least two I/O modules to an I/O base, and coupling a duplex terminal block to first and second ports of the I/O base. The duplex terminal block assembly includes a terminal block base portion having connectors for coupling with the I/O base of the associated I/O device, and a terminal block extending from the terminal block base portion and having connectors for connecting to the associated field device. The terminal block base portion has a width such that it is at least partially received in each of the at least two ports when installed in the I/O base. The duplex terminal block includes conductive structures for coupling each of the at least two I/O modules in parallel to the connectors.

BRIEF DESCRIPTION OF THE DRAWINGS

FIG. 3 is an exemplary distributed I/O system in accordance with the present disclosure;

DETAILED DESCRIPTION

Figure 1:
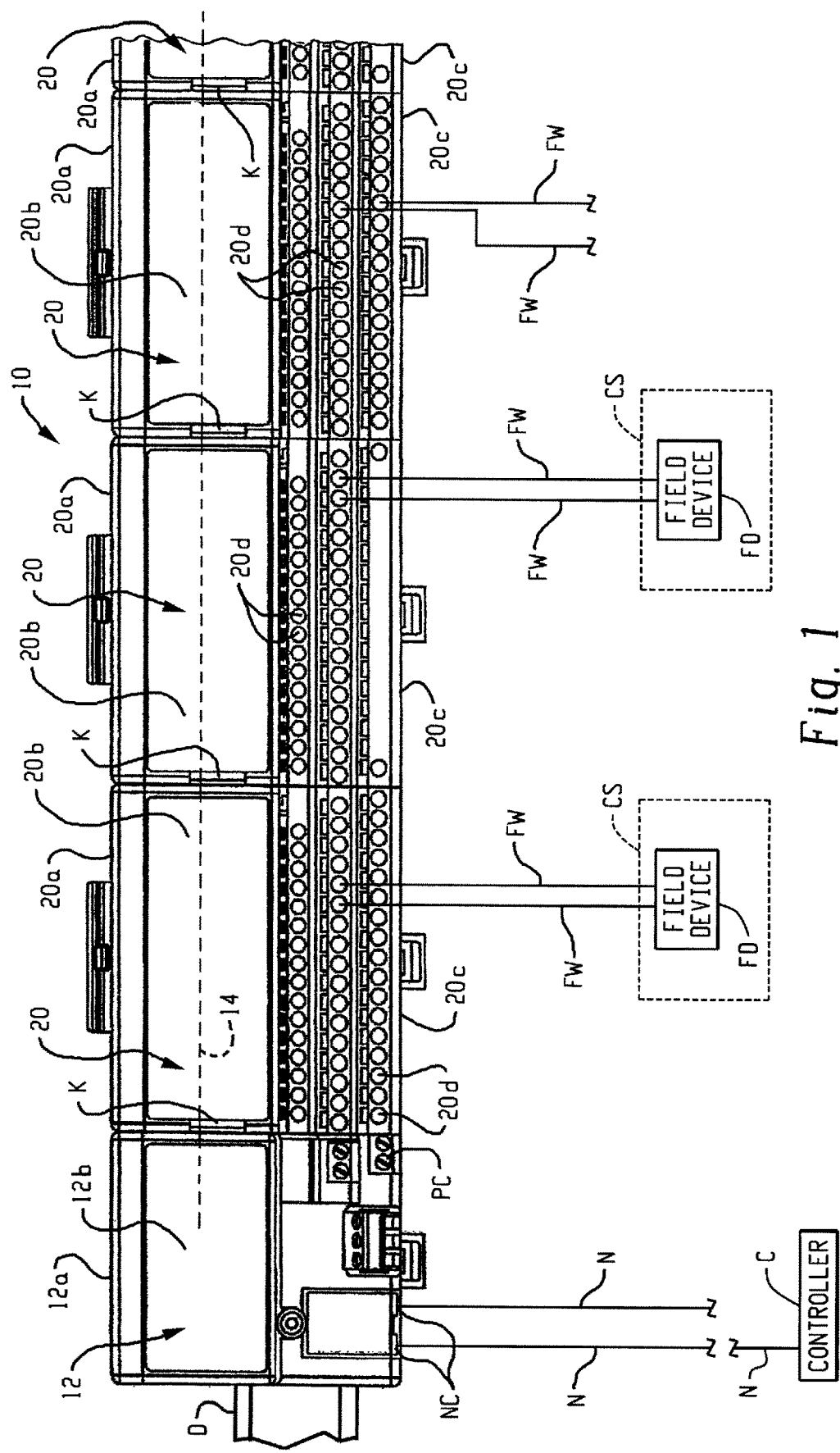
FIG. 1 shows an example of an industrial control system including an industrial automation controller and a known distributed modular input/output (I/O) system.
Figure 2A:
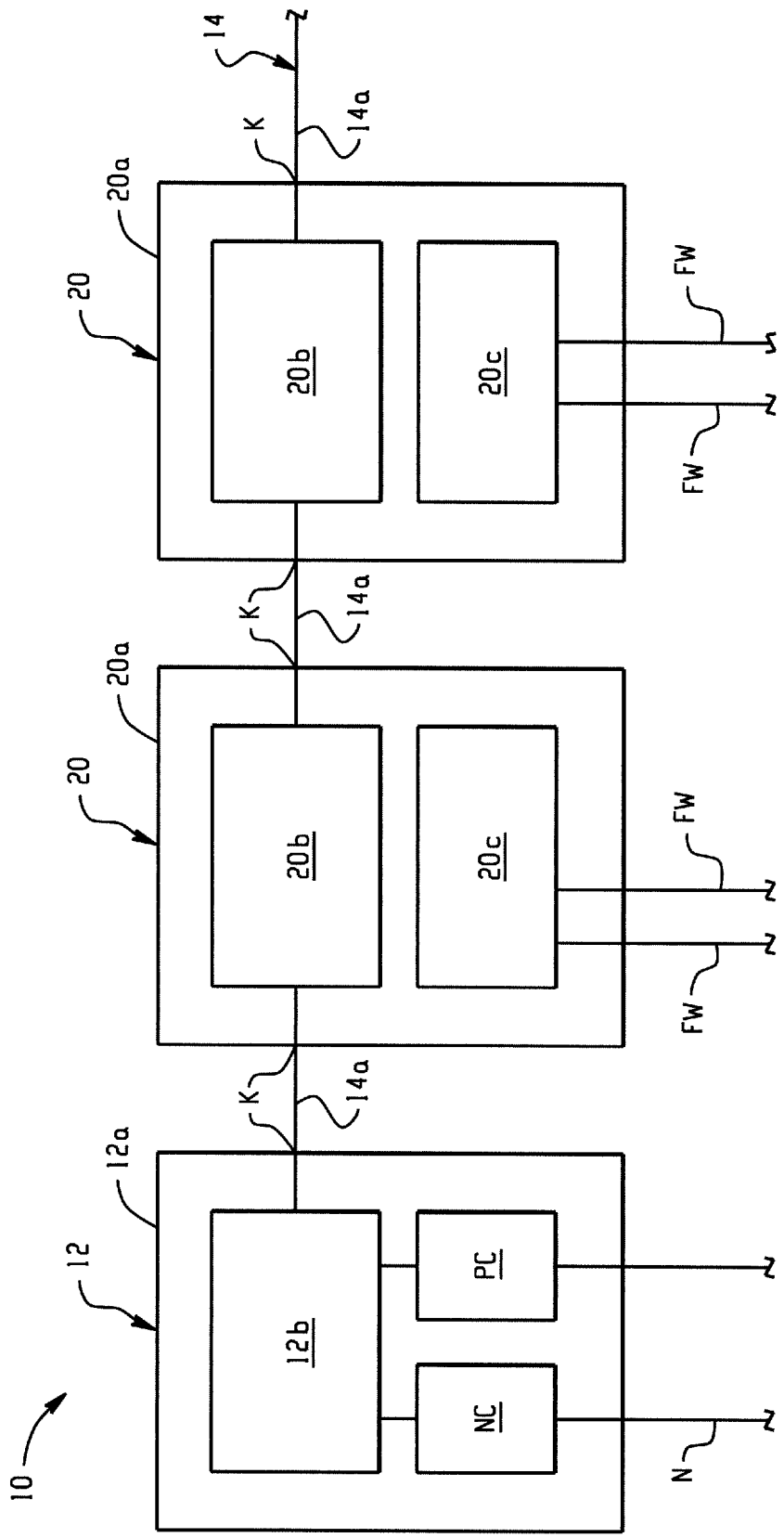
FIG. 2A is a schematic diagram of distributed modular I/O system.
Figure 2B:
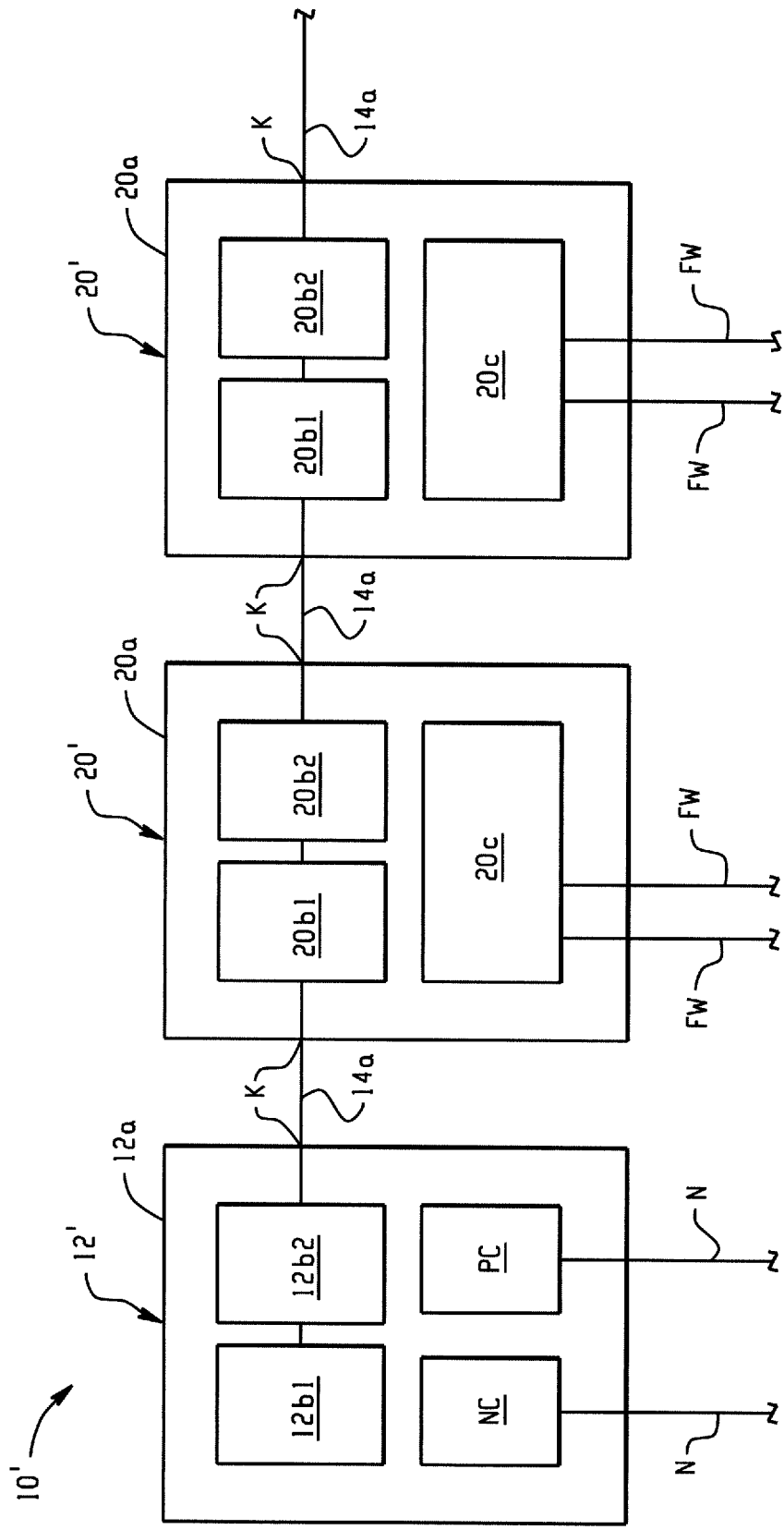
FIG. 2B is a schematic diagram of another distributed modular I/O system.

FIG. 3 shows a distributed modular I/O system 110 in accordance with an embodiment of the present development. As described in detail below, the system 110 includes terminal block assemblies that permit an I/O base to operate in simplex mode, duplex mode or a combination thereof, as desired.

The distributed modular I/O system 110 includes a network adapter 112 that is operatively connected to both first and second redundant industrial automation networks N1,N2 such as first and second Parallel Redundancy Protocol (PRP) LAN networks or the like such as an Ethernet/IP network or other industrial automation network so that the network adapter 112 receives data from, transmits data to, and otherwise communicates with one or more industrial control modules or "controllers" C1,C2 connected respectively to the networks N1,N2. The controllers C1,C2 can comprise one or more programmable logic controllers (PLC), microprocessors, and/or other electronic processors for machine and/or process control.

The network adapter 112 includes an adapter base 112a that is mounted to a rail D' or other support structure. The network adapter 112 further comprises first and second redundant adapter modules 112b1,112b2 that are operating in parallel with each other and each of which is permanently or releasably connected to the adapter base 112a. Each adapter module 112b1,112b2 is connected to both the first and second networks N1,N2 and includes the electronic circuitry for data communication data with the controllers C1,C2 via networks N1,N2 and for data communication with multiple I/O devices 120 of the system 110 as described below. The adapter 112 comprises one or more network connectors NC for connecting with the networks N1,N2 via known connectors such as RJ45 connectors, Small Form-Factor Pluggable (SFP) connectors, or the like.

The network adapter 112 further comprises first and second redundant power conditioning modules 116a,116b connected to the adapter base 112a and each including a power input connector PC for connecting with a source of electrical power for supplying system electrical power to the network adapter 112 and to the I/O devices 120 and other components operatively connected to the adapter 112 and/or I/O devices 120.

The I/O system 110 further comprises one or more I/O devices 120 that each include an I/O base 120a also mounted to the support rail D' or other support structure, with a first I/O base 120a located adjacent and operably physically and electrically connected to the adapter base 112a by a multi-contact electrical connector K and with the additional I/O bases 120a operably physically and electrically connected together one after the other in a sequential manner by successive mating multi-contact electrical connectors K such that a modular backplane circuit or "backplane" (schematically illustrated at 114) is constructed and adapted for communicating electrical power and data through the successively connected I/O bases 120a and operably connects each I/O base 120a to the network adapter 112 and, thus, to the first and second networks N1,N2 and the first and second controllers C1,C2.

In addition to the I/O base 120a, each I/O device 120 further comprises at least two I/O modules 120b (120b1, 120b2, 120b3, 120b4, in FIG. 3) operatively removably connected to the I/O base 120a such that the installed I/O modules 120b also communicates with the network adapter 112 and the first and second controllers C1,C2 over the backplane 114a such that input/output data are provided between the controllers C1,C2 and each I/O module 120b via backplane 114a. Each installed I/O module 120b is selected and configured to perform one or more specialized input/output functions such as DC input, DC output, AC input, AC output, analog input and/or output, RTD and/or thermocouple input and/or thermocouple output, or the like as is generally known in the field of industrial automation.

In the illustrated embodiment, each I/O device 120 comprises four I/O modules 120b (120b1,120b2,120b3,120b4) operatively removably connected to the I/O base 120a, and at least two of the I/O modules 120b are identical to each other and operated in parallel to provide a redundancy with respect to each other (as shown, the I/O modules 120b3, 120b4 of the two illustrated I/O devices 120 are identical and operated redundantly in parallel with respect to each other).

Each I/O base 120a further supports two types of terminal blocks 120c1 and 120c2 comprising a plurality of cage clamps, spring clamps, screw terminals, or other wiring connectors 120d that are adapted to be connected to field cables or field wires FW that are each associated with a field device FD that is typically an analog or digital device such as a sensor, flow meter, switch, probe, thermocouple, RTD, encoder, or the like that is associated with the process or machine being controlled (the controlled system CS) by the controllers C1,C2. In the illustrated embodiment, each terminal block 120c1/120c2 is a separate structure that is assembled to the I/O base 120a, but in some embodiments the terminal blocks can be defined as an integral or one-piece part of the I/O base 120a. Different varieties of terminal blocks can be used depending upon the particular configuration required for the field device wiring connectors 120d, with some having different common terminals, ground connections, voltage supply terminals, and the like. Each installed I/O module 120b communicates with the field device wiring connectors 120d of the same I/O base 120a on which the I/O module 120b is physically installed. Input/output data are provided between the controllers C1,C2 and field device(s) FD connected to the corresponding I/O base 120a via backplane 114 and the network adapter modules 112b1,112b2.

In the illustrated embodiment, the redundant, parallel I/O modules 120b3,120b4 share a common terminal block 120c2 such that the redundant I/O modules 120b3,120b4 are operably connected to the same field wiring FW and field device FD to send data to and receive data from the controlled system. I/O modules 120b1 and 120b2 are coupled to respective terminal blocks 120c1 for communication to respective field wiring FW. It should now be appreciated, that terminal blocks 120c1 and 120c2 differ in form and function from each other, with terminal block 120c1 configured to connect a single I/O module to associated field wiring FW (simplex mode) and terminal block 120c2 configured to couple two I/O modules to associated field wiring FW (duplex mode).

Figure 4:
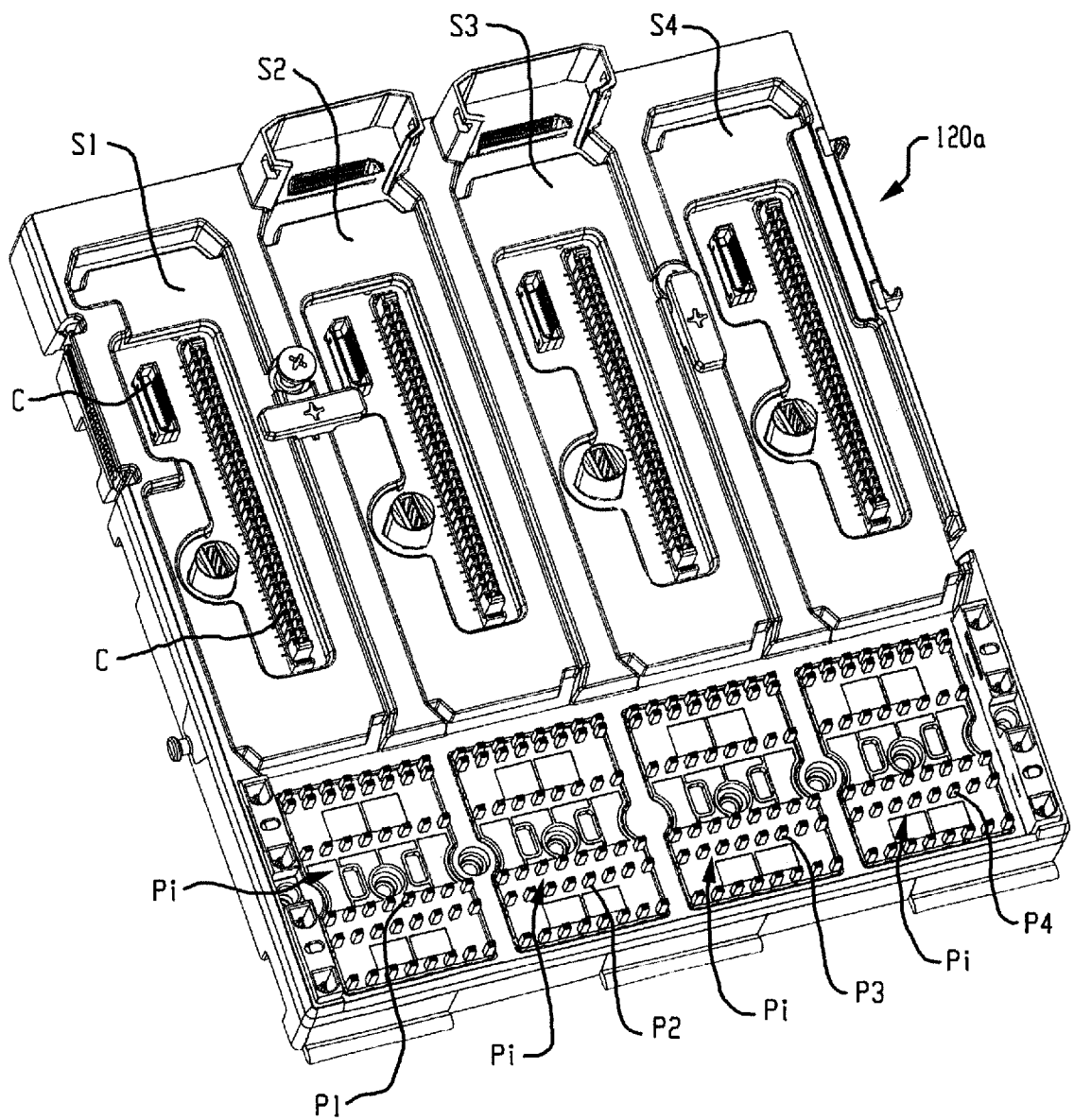
FIG. 4 is a perspective view of an I/O base.
Figure 5:
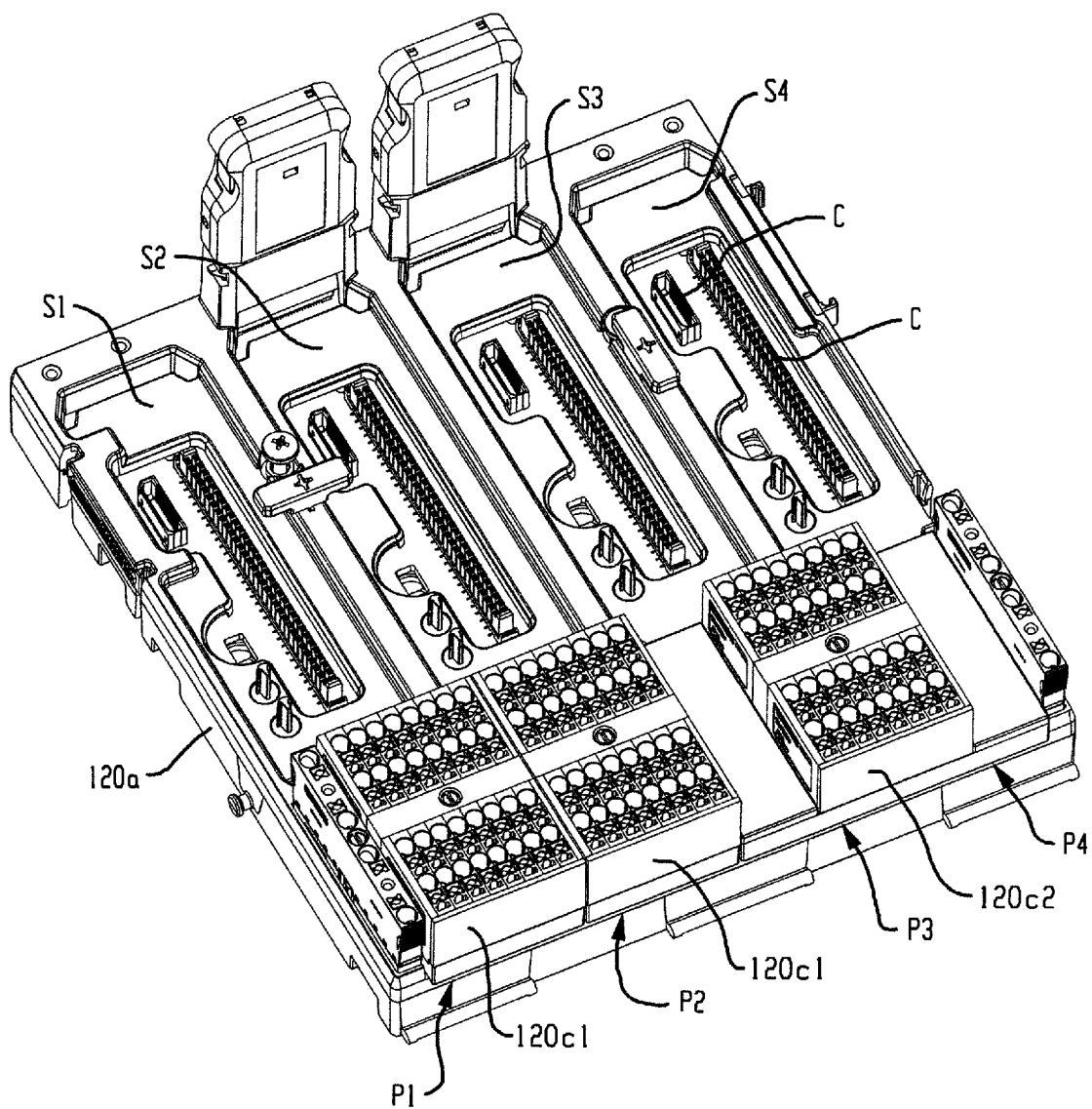
FIG. 5 is a perspective view of the I/O base of FIG. 4 with exemplary terminal block assemblies in accordance with the present disclosure.
Figure 6:
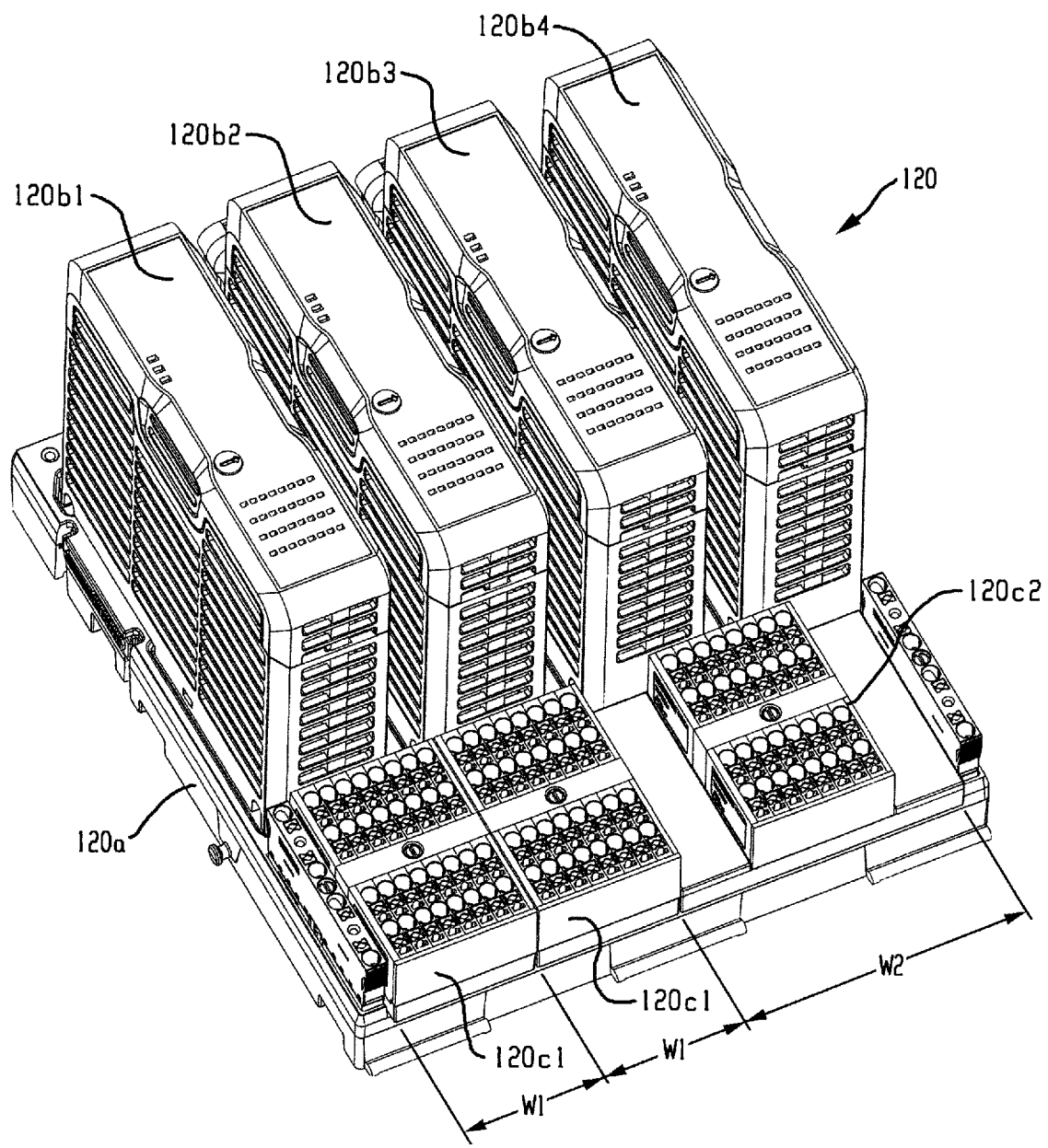
FIG. 6 is a perspective view of an I/O device in accordance with the present disclosure.

Turning to FIGS. 4-6, the two types of terminal blocks 120c1 and 120c2 are illustrated in detail as part of an I/O module 120 including I/O modules 120b1-120b2. In FIG. 4, an I/O base 120a is illustrated without I/O modules or terminal blocks installed. The I/O base 120a includes four slots S1, S2, S3 and S4 for receiving I/O modules and four corresponding ports P1, P2, P3, and P4 for receiving all or part of a terminal block assembly. Each slot S1-S4 includes connectors C for coupling an I/O module to a terminal block assembly and to the backplane of the I/O system. Each port P1-P4 includes a plurality of pins Pi adapted to be received in corresponding recesses of a terminal block assembly, as will be described below.

In FIG. 5, a pair of terminal block assemblies 120C1 are installed in ports P1 and P2 and a single terminal block assembly 120c2 is installed in ports P3 and P4. With additional reference to FIG. 6, it will be appreciated that each of I/O modules 120b1 and 120b2 are associated with a respective terminal block assembly 120c1 for connection to corresponding respective field wiring/devices (not shown), while both I/O modules 120b3 and 120b4 are associated with a common terminal block assembly 120c2 for connection to common field wiring/device (not shown). Terminal block assembly 120c1 has a width W1 that is approximately half of the width W2 of terminal block assembly 120c2. The width W1 of terminal block assembly 120c2 allows the terminal block assembly 120c2 to electrically couple with the pins Pi of both ports P3 and P4 such that I/O modules 120b3 and 120b4 can be coupled to a common field device in duplex mode.

Figure 7:
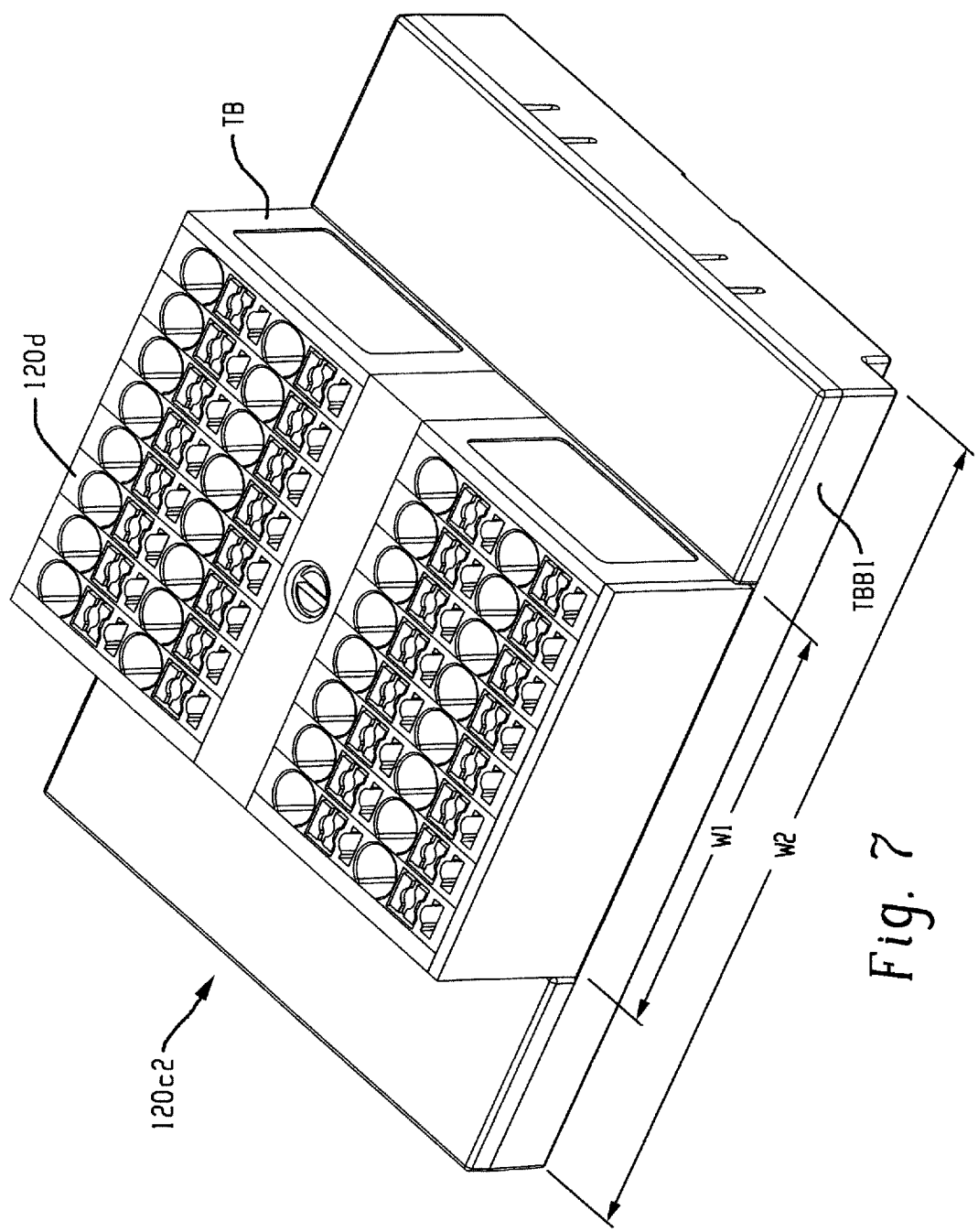
FIG. 7 is a perspective top view of a duplex terminal block assembly in accordance with the present disclosure.
Figure 8:
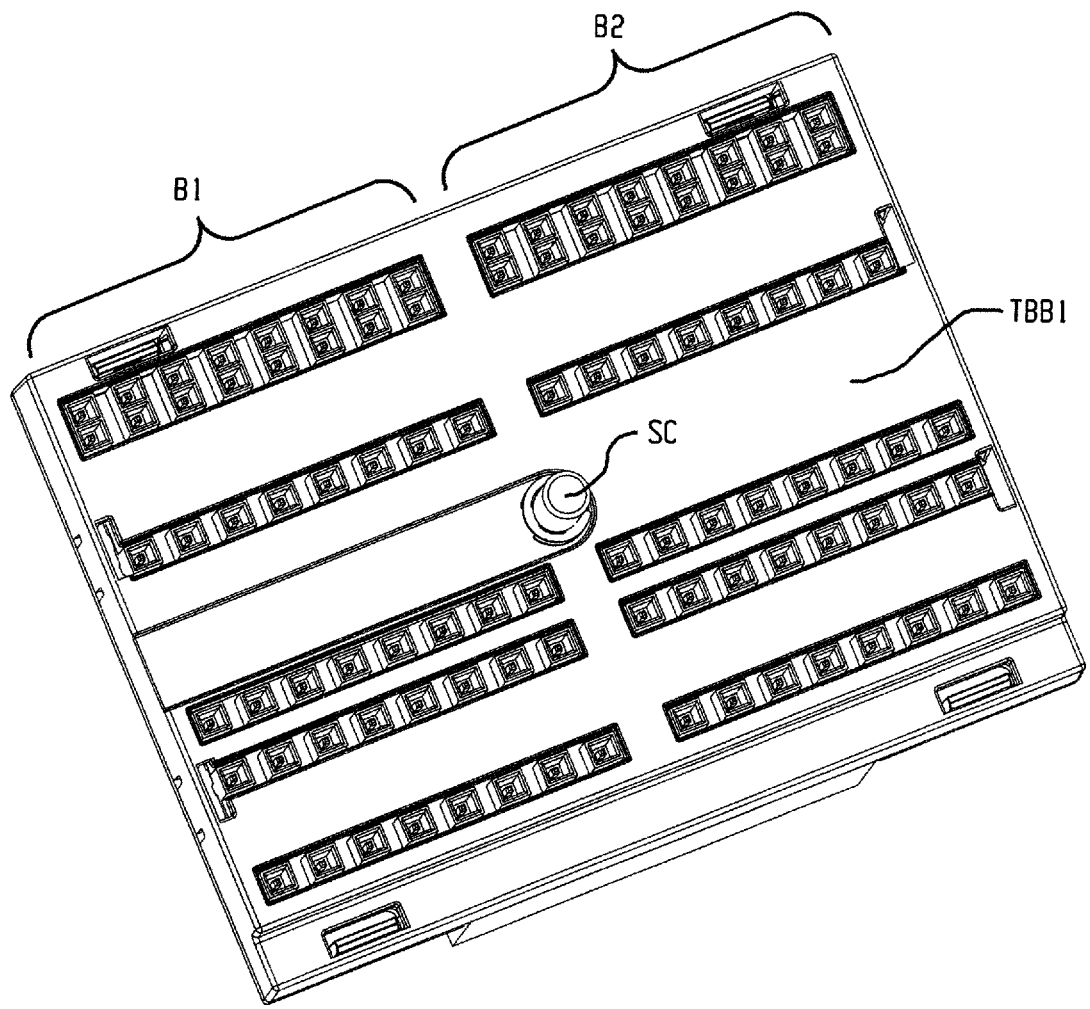
FIG. 8 is a perspective bottom view of the duplex terminal block assembly of FIG. 7.

FIGS. 7 and 8 illustrate an exemplary terminal block assembly 120c2 in detail. The terminal block assembly 120c2 includes a terminal block base TBB1 having width W2. A terminal block TB is supported on the terminal block base TBB1. The terminal block TB is generally centered along the width W of the terminal block base TBB1. The bottom side of the terminal block base TBB1 includes first and second banks of recesses B1 and B2 adapted to receive pins Pi of each port in which the terminal block assembly 120c2 is installed. The first and second banks of recesses B1 and B2 are configured to electrically coupled the pins of each port to wiring connectors 120d on an opposite side of the terminal block assembly 120c2 that are adapted to be connected to field cables or field wires FW that are each associated with a field device FD that is typically an analog or digital device such as a sensor, flow meter, switch, probe, thermocouple, RTD, encoder, or the like that is associated with the process or machine being controlled. Thus, it will be appreciated that the terminal block assembly 120c2 includes wires, traces or other conductive structures for coupling each recess of each bank B1 and B2 to a respective cage clamp, spring clamp, screw terminal, or other structure of wiring connectors 120d. A screw Sc is provided for securing the terminal block assembly 120c2 to the I/O base 120a. The terminal block base TBB1 is approximately twice the width of the terminal block TB.

Figure 9:
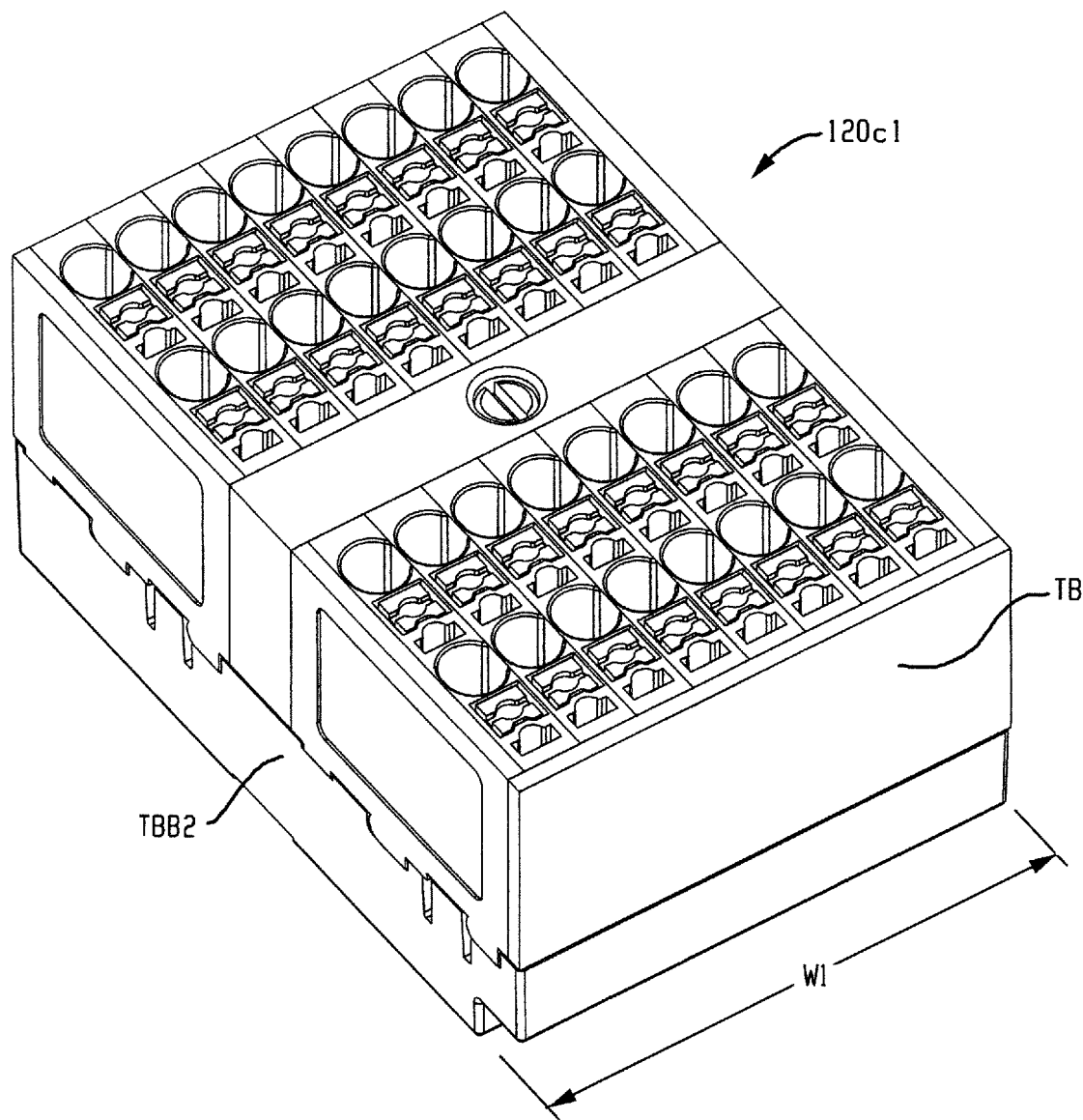
FIG. 9 is a perspective top view of a simplex terminal block assembly in accordance with the present disclosure.
Figure 10:
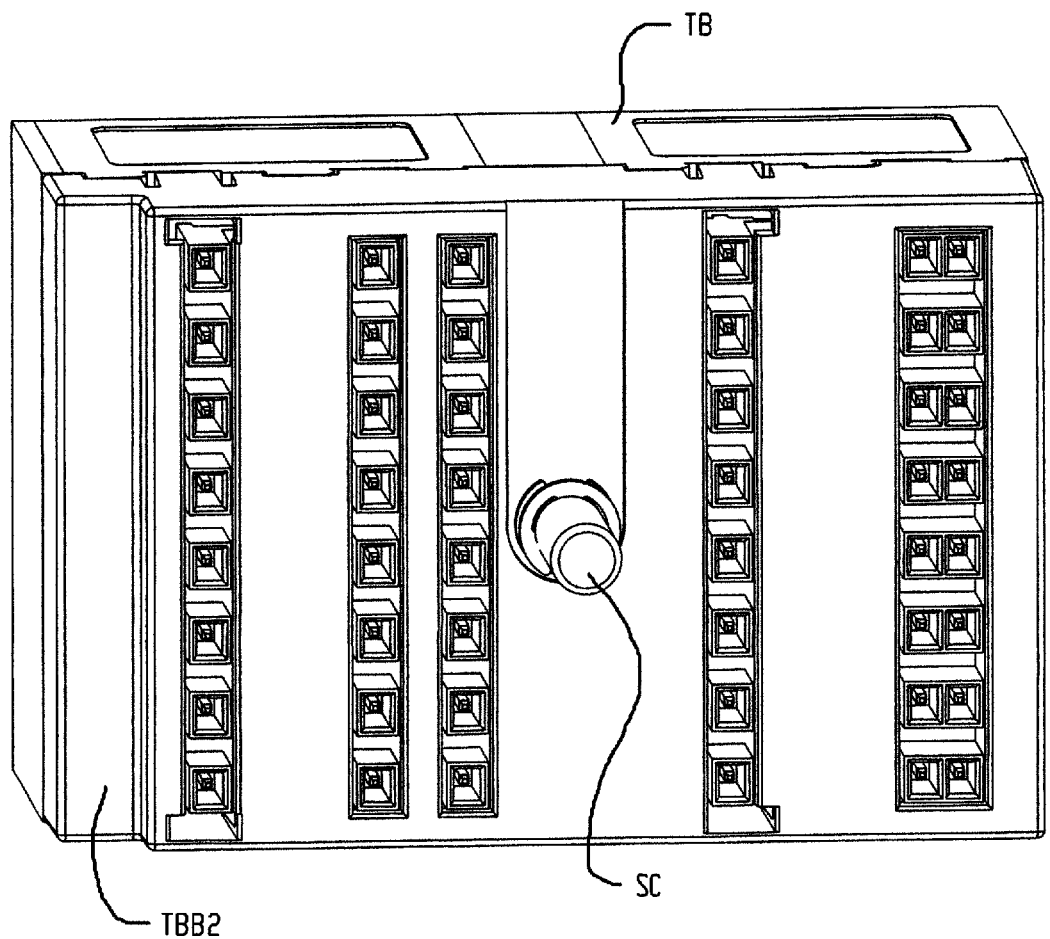
FIG. 10 is a perspective bottom view of the simplex terminal block assembly of FIG. 9.

The terminal block 120c2 is sometimes referred to as a duplex terminal block as it can be used to connect two I/O modules to a common field device in systems where redundancy is required or desired. In contrast, and with reference to FIGS. 9 and 10, terminal block 120c1 is sometimes referred to as a simplex terminal block assembly as it is configured to connect a single I/O module to a field device. Terminal block assembly 120c1 generally comprises a terminal block base TBB2 and a terminal block TB supported thereon. In this embodiment, the terminal block TB and the terminal block base TBB2 have a corresponding width W1. It will be appreciated that the terminal block assembly 120c1 can be received in a port of the I/O base 120a to connect a field device to a respective I/O module in an otherwise conventional manner. A screw Sc is provided for securing the terminal block assembly 120c2 to the I/O base 120a.

The terminal block assemblies 120c12 and 120c2 allow customization of an I/O system having at least two slots for receiving I/O modules and corresponding ports for receiving terminal block assemblies. Although the illustrated embodiment is directed to a quad slot I/O device, aspects of the present disclosure can be adapted to any I/O device having at least 2 slots. It should be appreciated that the terminal block TB in each of the terminal block assemblies 120c1 and 120c2 is a common element that can be used with either terminal block base TBB1 or TBB2. This construction further enhances the modularity of the I/O system by allowing a single terminal block TB to be used in either duplex or simplex fashion depending on the terminal block base to which it is associated. Although it should be appreciated that separate, dedicated terminal blocks can be provided in accordance with aspects of the present disclosure. Aspects of the present disclosure facilitate customization of I/O devices in the field by allowing a technician to select a terminal block assembly for a particular application depending on whether simplex or duplex functionality is desired, and/or to easily retrofit existing installations for duplex functionality.

Figure 11:
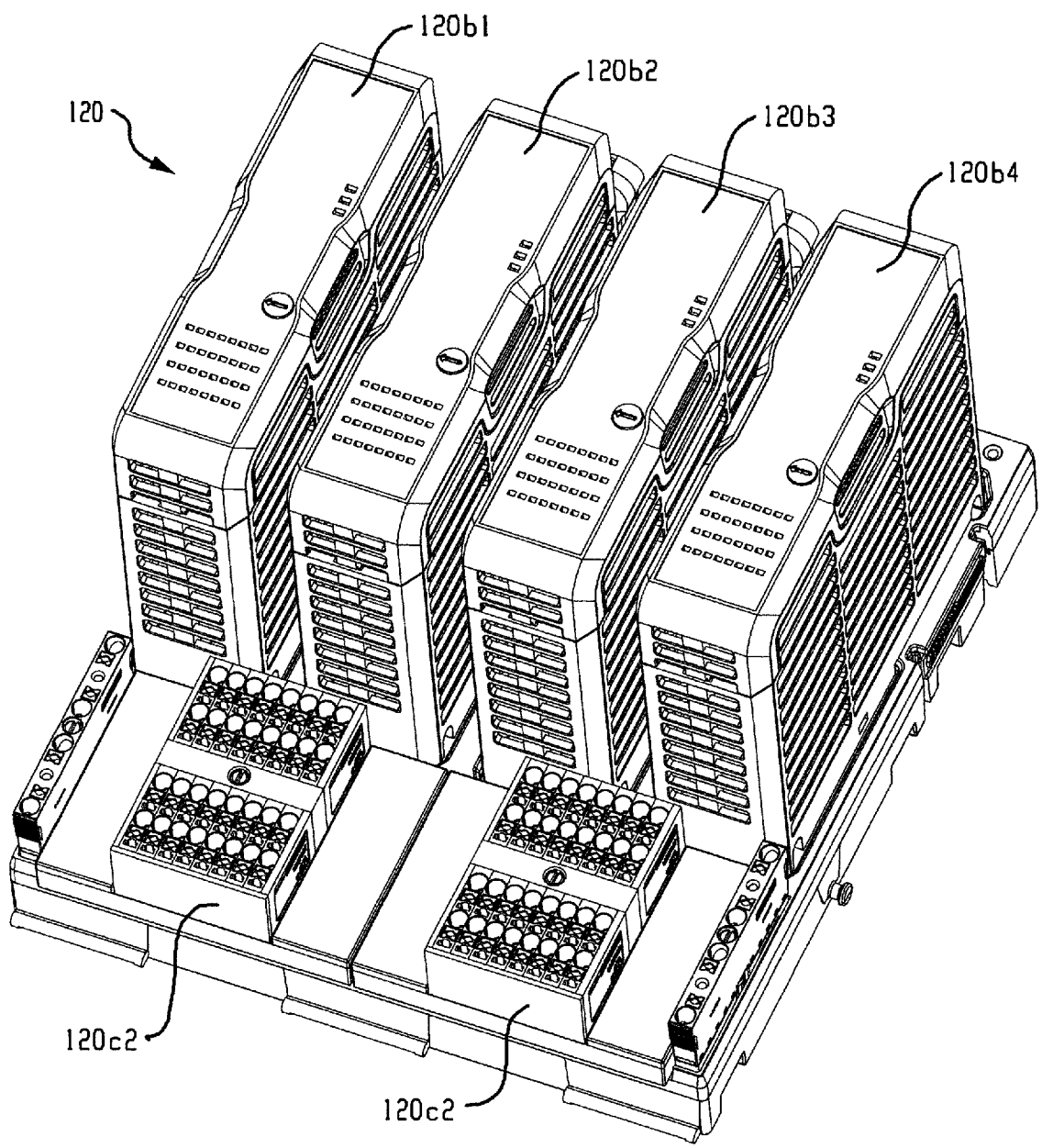
FIG. 11 is a perspective view of an I/O device having a first configuration.

Turning to FIGS. 11-14, four different I/O device configurations are shown using various combinations of the terminal block assemblies 120c1 and 120c2. In FIG. 11, an I/O device 120 is shown having four I/O modules 120b1-120b4 in a first configuration. I/O modules 120b1 and 120b2 are coupled to a duplex terminal block assembly 120c2 to provide redundancy to a first associated field device (not shown), while I/O modules 120b3 and 120b4 are coupled to a duplex terminal block assembly 120c2 to provide redundancy to a second associated field device (not shown).

Figure 12:
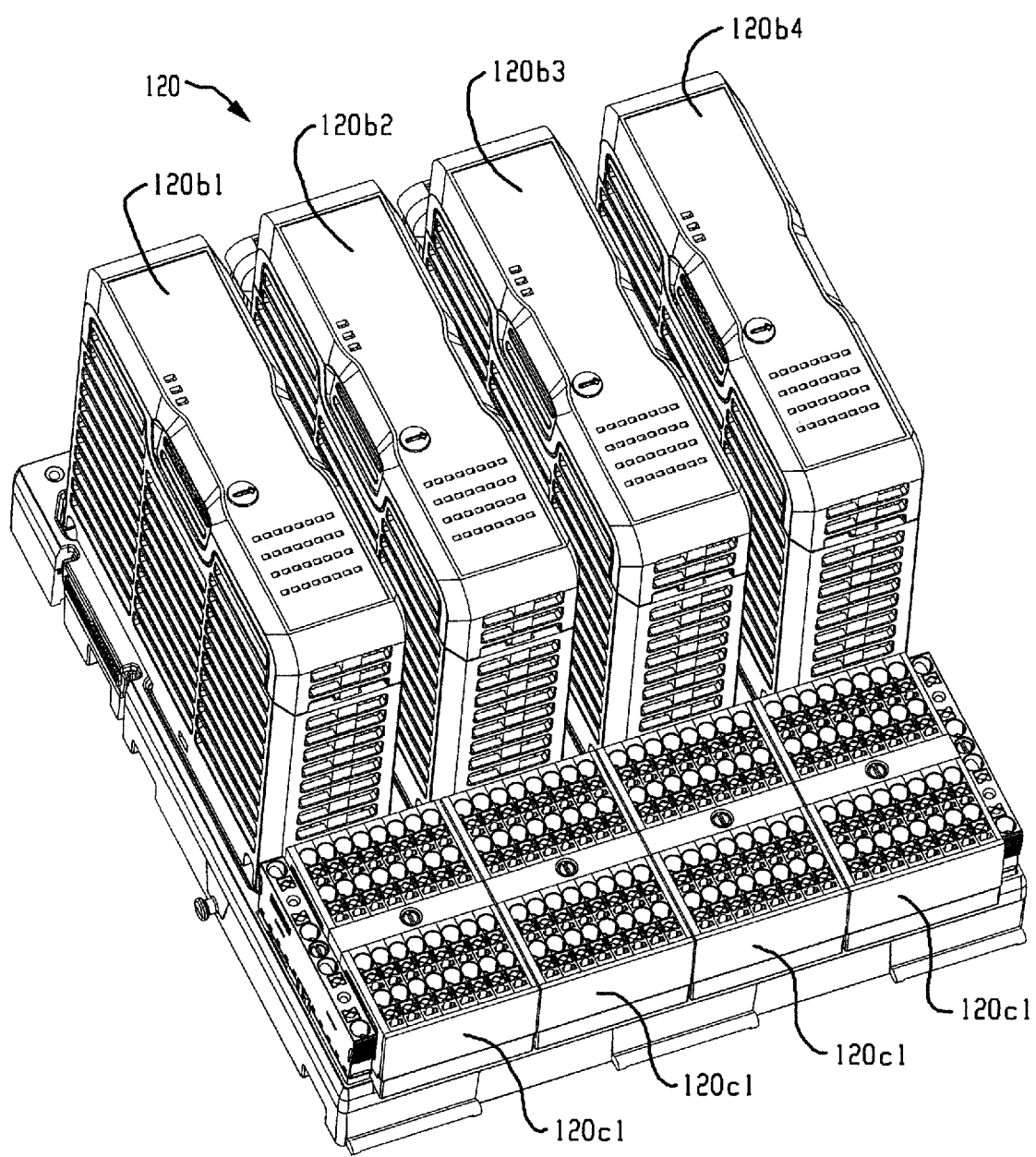
FIG. 12 is a perspective view of an I/O device having a second configuration.

In FIG. 12, an I/O device 120 is shown having four I/O modules 120b1-120b4 in a second configuration. In this embodiment, each I/O module 120b1-120b4 is coupled to a simplex terminal block assembly 120c1 for communication with a respective field device (not shown).

Figure 13:
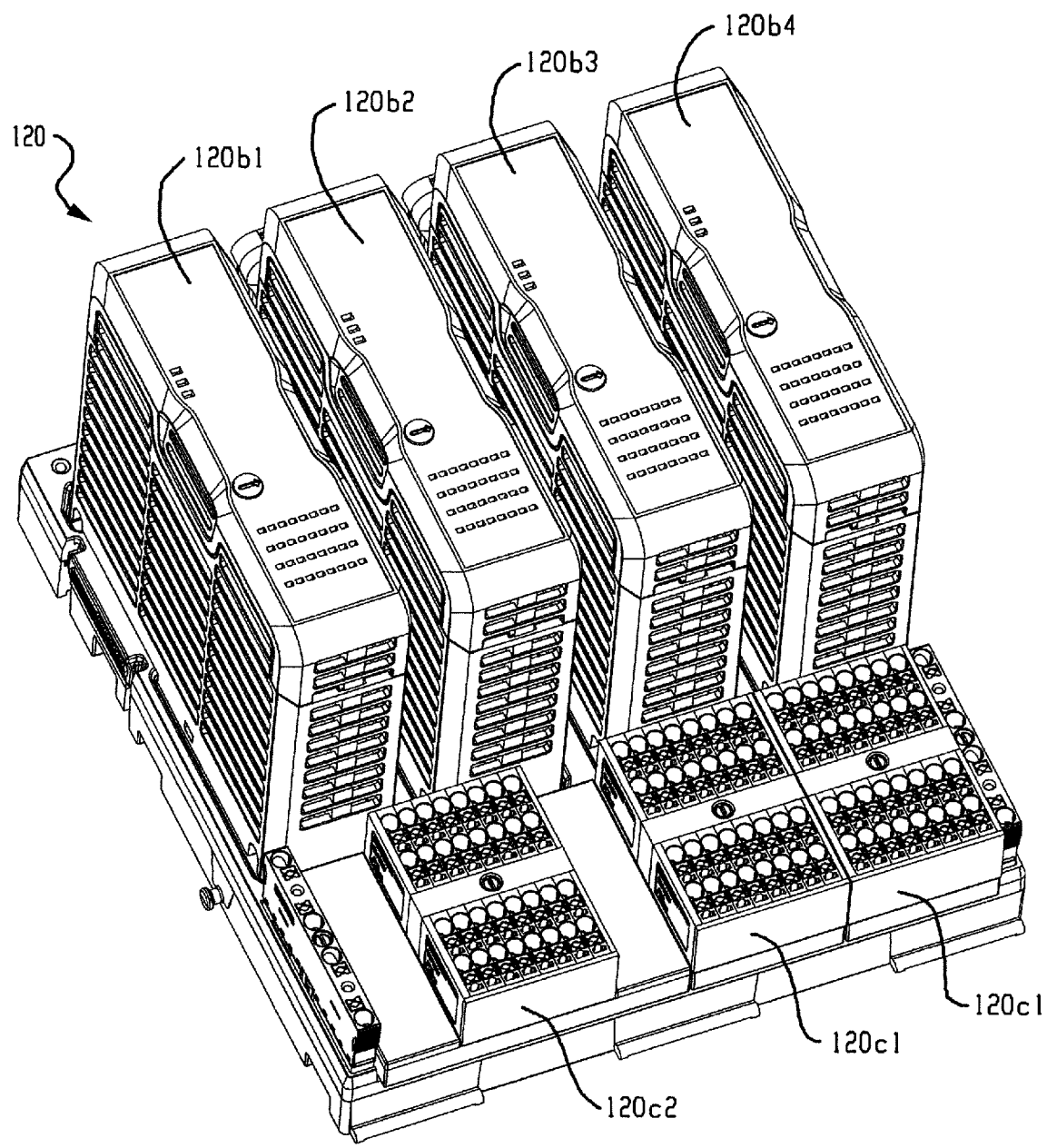
FIG. 13 is a perspective view of an I/O device having a third configuration.
Figure 14:
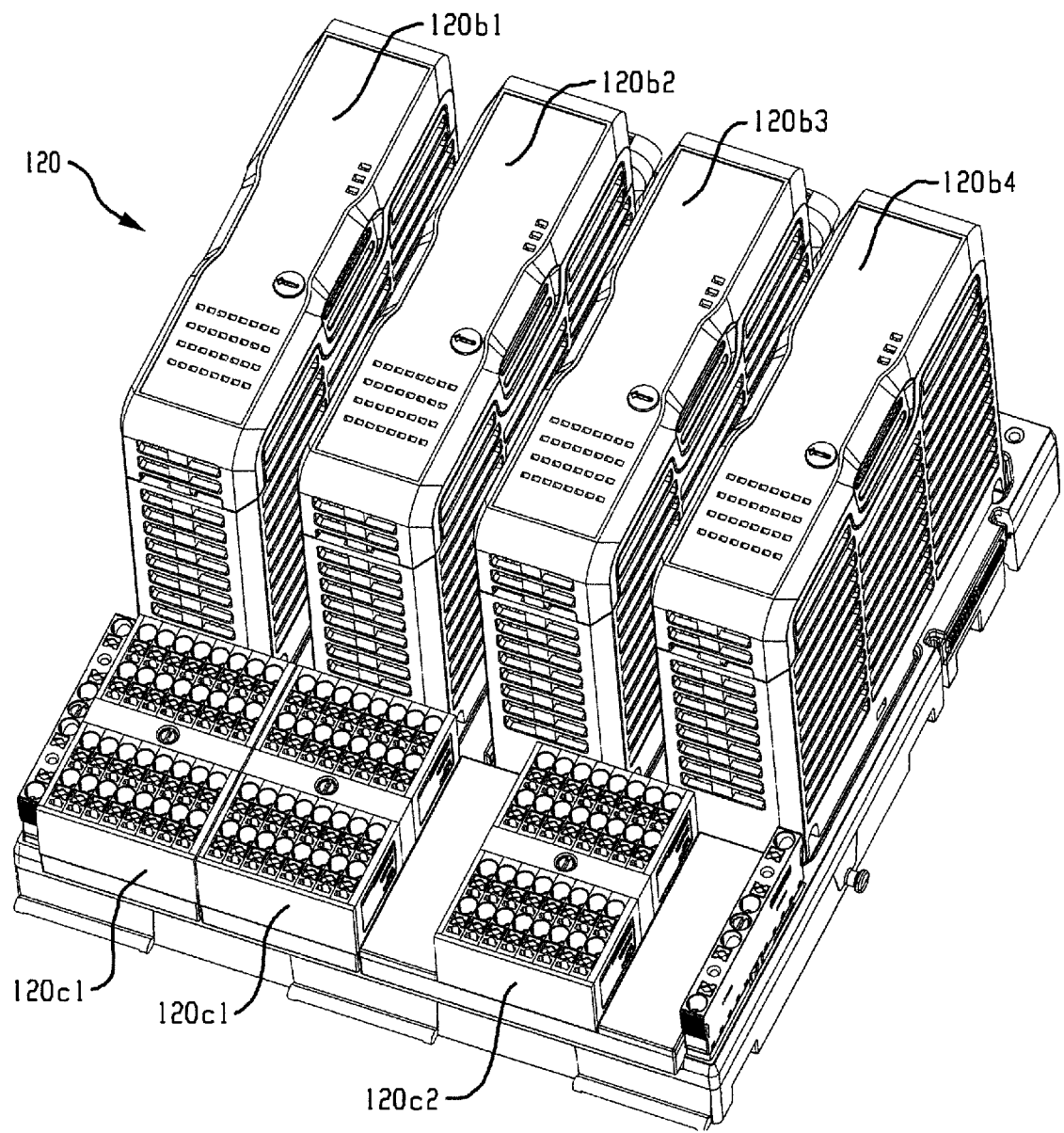
FIG. 14 is a perspective view of an I/O device having a fourth configuration.

FIGS. 13 and 14 illustrate I/O devices 120 having third and fourth configurations. A third configuration is shown in FIG. 13 wherein I/O modules 120b1 and 120b2 are coupled to a duplex terminal block assembly 120c2 and I/O modules 120b3 and 120b4 are coupled to respective simplex terminal block assemblies 120c1. FIG. 14 illustrates a fourth configuration wherein I/O modules 120b1 and 120b2 are coupled to respective simplex terminal block assemblies 120c1 and I/O modules 120b3 and 120b4 are coupled to a duplex terminal block assembly 120c2.

Figure 15:
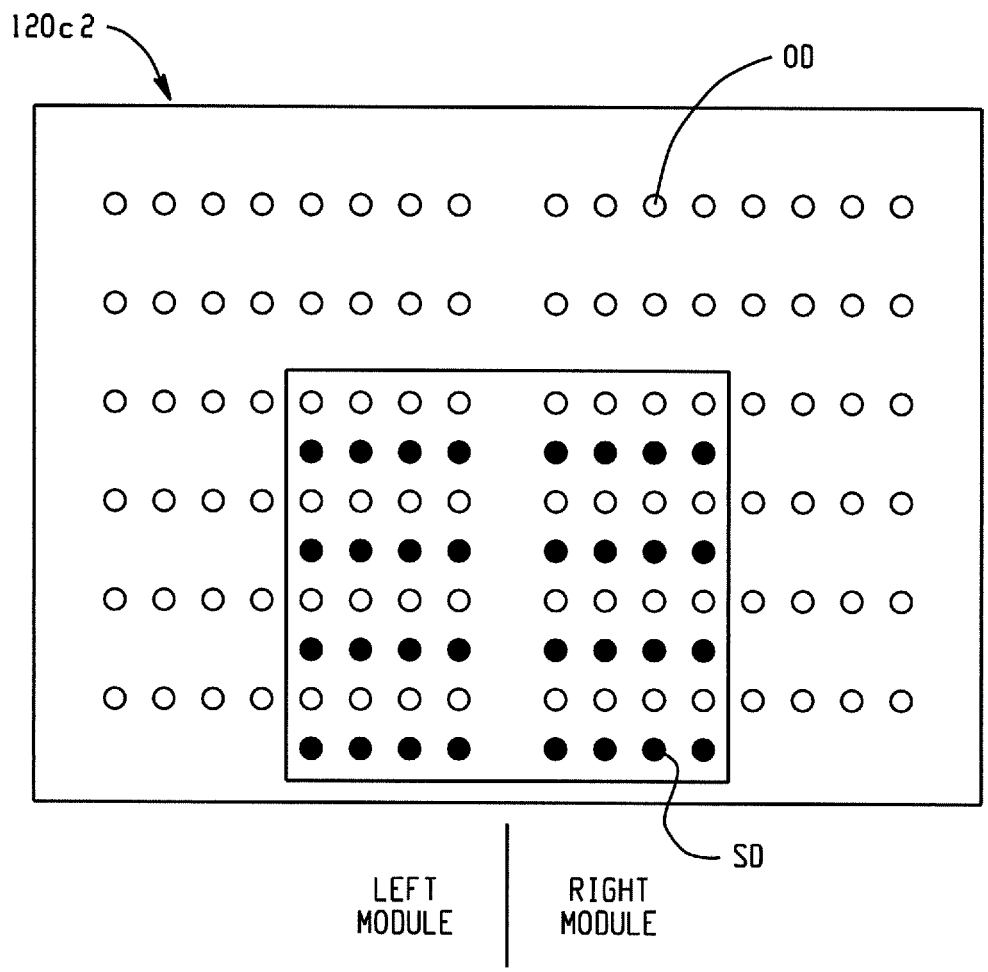
FIG. 15 is a schematic illustration of the I/O upper and lower I/O connections of an exemplary duplex terminal block assembly in accordance with the present disclosure.

FIGS. 15 and 16 schematically illustrate an exemplary duplex terminal block 120c2. The solid dots SD represent I/O connections on an upper side of the duplex terminal block assembly 120c2 that are generally connected to an associated field device when the duplex terminal block assembly is installed in an I/O device, as previously described. The open dots OD represent the I/O connections on the lower side of the duplex terminal block assembly 120c2. The open dots OD are divided into two groups corresponding to a left I/O module and a right I/O module as indicated in FIG. 15. As will be appreciated, each respective group of open dots representing lower I/O connections are generally connected to a respective I/O module when the duplex terminal block assembly is installed in an I/O device.

Figure 16A:
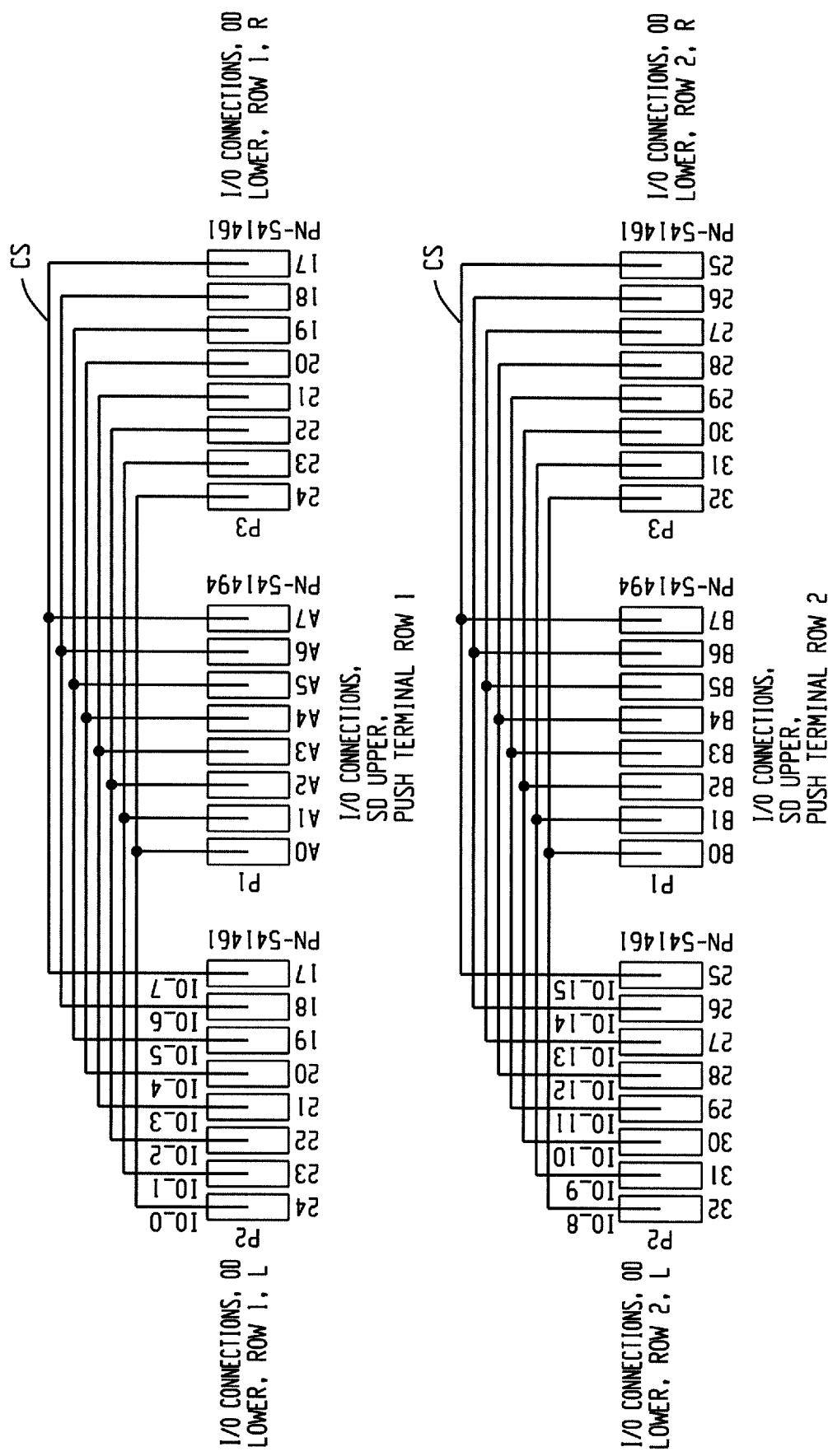
FIG. 16 (comprising FIGS. 16A and 16B) is a schematic illustration of the routing of each I/O connection between an upper side (field device connection side) and a lower side (I/O base connection side) of the duplex terminal block assembly of FIG. 15.
Figure 16B:
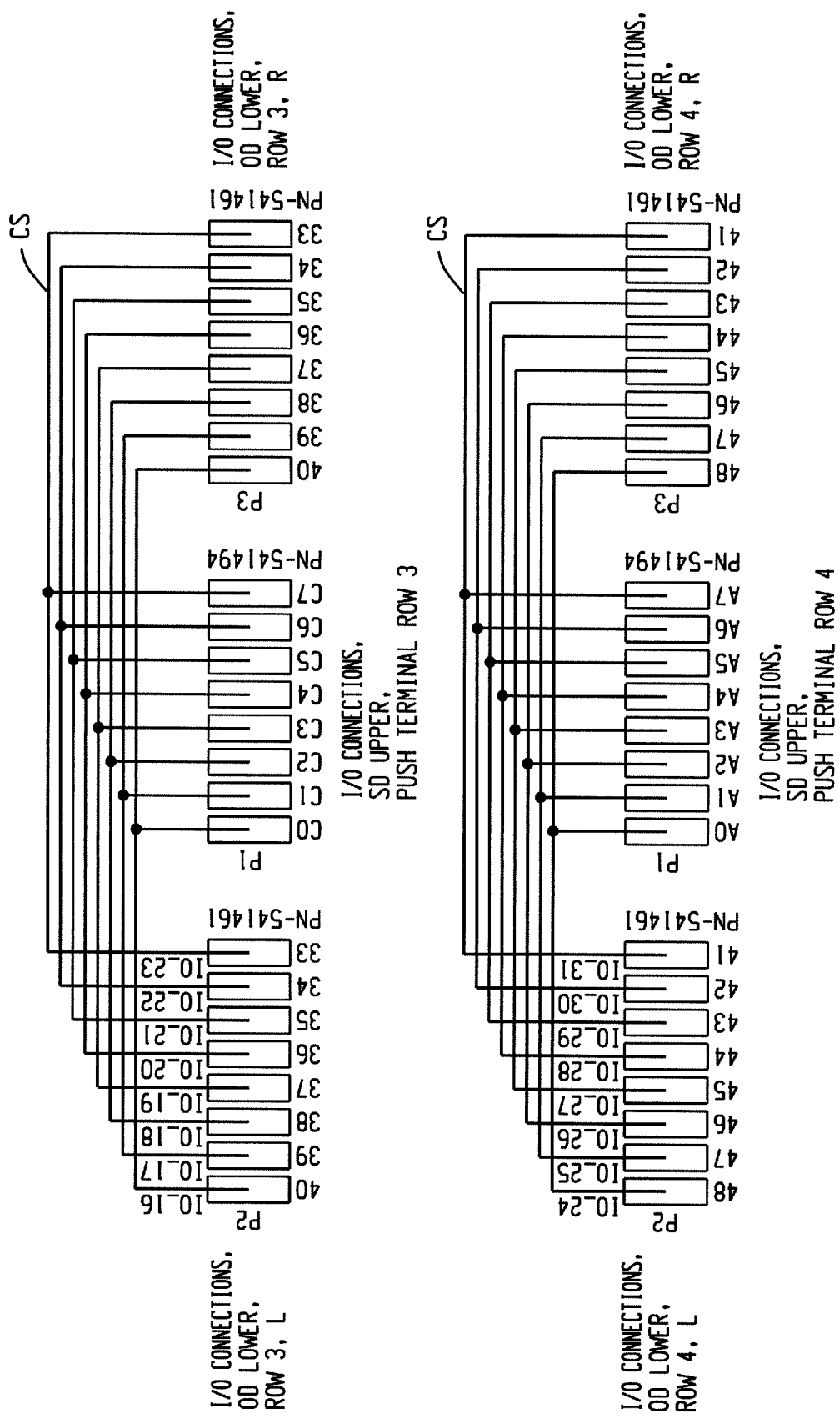

FIG. 16 (comprising FIGS. 16A and 16B) schematically illustrates the routing between the upper I/O connections SD and lower I/O connections OD. As will be appreciated, each of the upper I/O connections SD is coupled to a lower I/O connection OD in each of the left and right groups of I/O connections by conductive structure CS of the duplex terminal block assembly 120c2.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:
1. An I/O device comprising:
an I/O base;
at least two I/O modules supported on the I/O base; and
a duplex terminal block assembly supported on the I/O base;
wherein the at least two I/O modules include a first I/O module and a second I/O module coupled to the duplex terminal block assembly in parallel;
wherein the duplex terminal block assembly includes a terminal block base and a terminal block supported on the terminal block base, the terminal block base having a width that is twice a width of the terminal block and the terminal block is centered along the width of the terminal block base; and
wherein the terminal block is received in a slot of the terminal block base.

2. An I/O device comprising:
an I/O base;
at least two I/O modules supported on the I/O base; and
a duplex terminal block assembly supported on the I/O base;
wherein the at least two I/O modules include a first I/O module and a second I/O module coupled to the duplex terminal block assembly in parallel; and
further comprising a third I/O module and a simplex terminal block assembly electrically coupled to the third I/O module.

3. The I/O device of claim 2, wherein the simplex terminal block assembly has a width that is half a width of the duplex terminal block assembly.

4. The I/O device of claim 3, wherein the I/O base includes a plurality of ports, each port adapted to couple one of the plurality of I/O modules to a terminal block assembly, and wherein the duplex terminal block is received in at least two ports associated with the first and second I/O modules, and wherein the simplex terminal block is received in a port associated with the third I/O module.

5. A duplex terminal block assembly for use with an associated I/O device having an I/O base with at least two ports for receiving at least a portion of a terminal block assembly and at least two I/O modules supported on the I/O base, the duplex terminal block assembly comprising:
a terminal block base portion having connectors for coupling with the I/O base of the associated I/O device; and
a terminal block extending from the terminal block base portion and having connectors for connecting to an associated field device;
wherein the terminal block base portion has a width such that it is at least partially received in each of the at least two ports when installed in the I/O base; and
wherein the duplex terminal block includes conductive structures for coupling each of the at least two I/O modules in parallel to the connectors.

6. The duplex terminal block assembly of claim 5, wherein the terminal block base portion has a width that is twice a width of the terminal block.

7. The duplex terminal block assembly of claim 6, wherein the terminal block is centered along the width of the terminal block base portion.

8. The duplex terminal block assembly of claim 7, wherein the terminal block and terminal block base portion are separate components assembled together to form the duplex terminal block assembly.

9. The duplex terminal block assembly of claim 8, wherein the terminal block is received in a slot of the terminal block base portion.

10. A method of assembling an I/O device having at least two I/O modules connected in duplex to a field device, the method comprising:
coupling at least two I/O modules to an I/O base;
coupling a duplex terminal block to first and second ports of the I/O base;
wherein the duplex terminal block assembly includes a terminal block base portion having connectors for coupling with the I/O base of the associated I/O device, and a terminal block extending from the terminal block base portion and having connectors for connecting to the associated field device;
wherein the terminal block base portion has a width such that it is at least partially received in each of the at least two ports when installed in the I/O base; and
wherein the duplex terminal block includes conductive structures for coupling each of the at least two I/O modules in parallel to the connectors.

* * * * *